(12) United States Patent
Suzuki et al.

(10) Patent No.: US 9,030,587 B2
(45) Date of Patent: May 12, 2015

(54) SOLID-STATE IMAGE SENSOR WITH LIGHT-GUIDING PORTION

(71) Applicant: Canon Kabushiki Kaisha, Tokyo (JP)

(72) Inventors: Kentarou Suzuki, Kawasaki (JP); Yukihiro Hayakawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

(21) Appl. No.: 13/895,440

(22) Filed: May 16, 2013

(65) Prior Publication Data

US 2013/0314576 A1 Nov. 28, 2013

(30) Foreign Application Priority Data

May 25, 2012 (JP) ................................. 2012-120137

(51) Int. Cl.
*H01L 27/146* (2006.01)
*H04N 5/374* (2011.01)

(52) U.S. Cl.
CPC .......... *H01L 27/14625* (2013.01); *H04N 5/374* (2013.01); *H01L 27/14621* (2013.01); *H01L 27/14627* (2013.01); *H01L 27/14629* (2013.01); *H01L 27/14641* (2013.01)

(58) Field of Classification Search
CPC .......................... H04N 3/155; H01L 27/14685
USPC ................... 348/308; 250/208.1; 257/432
See application file for complete search history.

(56) References Cited

U.S. PATENT DOCUMENTS

| | | | |
|---|---|---|---|
| 6,259,083 B1 * | 7/2001 | Kimura | 250/208.1 |
| 6,781,210 B2 * | 8/2004 | Sugimoto et al. | 257/435 |
| 7,135,666 B2 * | 11/2006 | Dobashi | 250/208.1 |
| 7,358,583 B2 * | 4/2008 | Reznik et al. | 257/432 |
| 7,615,399 B2 * | 11/2009 | Lee | 438/70 |
| 8,542,311 B2 * | 9/2013 | Lenchenkov | 348/340 |
| 2006/0054946 A1 | 3/2006 | Baek et al. | 257/292 |
| 2006/0115230 A1 * | 6/2006 | Komoguchi et al. | 385/146 |
| 2007/0200055 A1 * | 8/2007 | Reznik et al. | 250/208.1 |
| 2008/0079031 A1 | 4/2008 | Tani | 257/225 |
| 2008/0157152 A1 * | 7/2008 | Shim | 257/292 |
| 2009/0166518 A1 * | 7/2009 | Tay et al. | 250/227.11 |
| 2009/0189055 A1 * | 7/2009 | Lin et al. | 250/208.1 |
| 2010/0123811 A1 * | 5/2010 | Abe | 348/294 |

(Continued)

FOREIGN PATENT DOCUMENTS

| | | | |
|---|---|---|---|
| JP | 2004-221532 A | 8/2004 |
| JP | 2006-080533 A | 3/2006 |

(Continued)

*Primary Examiner* — Roberto Velez
*Assistant Examiner* — Cynthia Segura
(74) *Attorney, Agent, or Firm* — Fitzpatrick, Cella, Harper & Scinto

(57) ABSTRACT

A solid-state image sensor comprising a photoelectric conversion portion, a MOS transistor, a first insulating layer, a second insulating layer whose refractive index is higher than that of the first insulating layer, and a light-guiding portion including a first portion and a second portion formed on the first portion, wherein an angle that the side face of the first portion makes with a plane parallel to a light-receiving face of the photoelectric conversion portion is smaller than an angle that a side face of the second portion makes with the parallel plane, and a boundary between the first portion and the second portion is positioned higher than an upper face of a gate electrode of the MOS transistor, and lower than a boundary between the first insulating layer and the second insulating layer.

10 Claims, 14 Drawing Sheets

(56) References Cited

U.S. PATENT DOCUMENTS

| | | | |
|---|---|---|---|
| 2010/0194965 A1 | 8/2010 | Yamazaki | 348/340 |
| 2010/0213559 A1 | 8/2010 | Mizuno | 257/432 |
| 2010/0230578 A1 | 9/2010 | Horikoshi et al. | 250/208.1 |
| 2010/0308427 A1* | 12/2010 | Lenchenkov | 257/432 |
| 2012/0018831 A1* | 1/2012 | Kim et al. | 257/432 |
| 2012/0049305 A1* | 3/2012 | Takami et al. | 257/432 |
| 2012/0267742 A1* | 10/2012 | Yano | 257/432 |
| 2013/0001724 A1* | 1/2013 | Masuda | 257/432 |

FOREIGN PATENT DOCUMENTS

| | | |
|---|---|---|
| JP | 2008-085174 A | 4/2008 |
| JP | 2010-182765 A | 8/2010 |
| JP | 2010-199258 A | 9/2010 |
| JP | 2010-212535 A | 9/2010 |
| JP | 2011-508457 A | 3/2011 |
| JP | 2012-114155 A | 6/2012 |
| WO | WO 2009/091484 A1 | 7/2009 |

* cited by examiner

F I G. 1
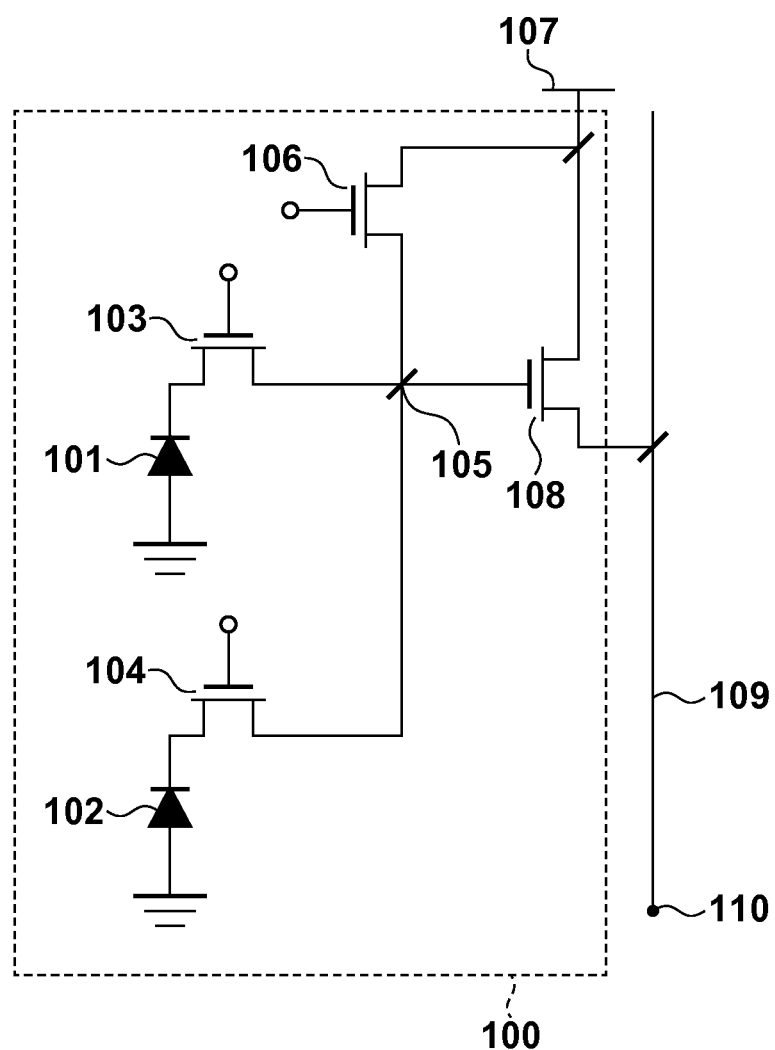

SOLID-STATE IMAGE SENSOR WITH LIGHT-GUIDING PORTION

BACKGROUND OF THE INVENTION

1. Field of the Invention

The present invention relates to a solid-state image sensor.

2. Description of the Related Art

A technique of improving the focusing property of light by forming a lightguide in a region on a photoelectric conversion portion such as a photodiode which constitutes a pixel is known. Japanese Patent Laid-Open No. 2004-221532, for example, discloses a structure in which the width of a lightguide, that is, a light-guiding portion decreases from the light incident side to the light reception side (the side on which a photoelectric conversion portion is formed). According to Japanese Patent Laid-Open No. 2004-221532, this structure receives a large amount of incident light to improve the focusing property.

Also, Japanese Patent Laid-Open No. 2008-85174 discloses a structure which uses a lightguide having a light-guiding portion with a vertical side surface on the light incident side, and an inclined side surface near the light reception side (light wavelength range). According to Japanese Patent Laid-Open No. 2008-85174, this structure prevents evanescent light generated upon total reflection from leaking out of the light-guiding portion.

SUMMARY OF THE INVENTION

The present invention provides a technique advantageous in terms of suppressing leakage of light from a light-guiding portion while improving the focusing property.

One of the aspects of the present invention provides a solid-state image sensor comprising a photoelectric conversion portion, a MOS transistor, a first insulating layer which covers the photoelectric conversion portion and the MOS transistor, a second insulating layer which is provided on the first insulating layer and has a refractive index higher than a refractive index of the first insulating layer, and a light-guiding portion which is provided in the first insulating layer and the second insulating layer and is provided in correspondence with the photoelectric conversion portion, the light-guiding portion including a first portion, and a second portion arranged on the first portion, wherein an angle formed by the side face of the first portion and a plane parallel to a light-receiving face of the photoelectric conversion portion is smaller than an angle formed by a side face of the second portion and the parallel plane, and a boundary between the first portion and the second portion is positioned higher than an upper face of a gate electrode of the MOS transistor, and lower than a boundary between the first insulating layer and the second insulating layer.

Further features of the present invention will become apparent from the following description of exemplary embodiments with reference to the attached drawings.

BRIEF DESCRIPTION OF THE DRAWINGS

FIG. 1 is a circuit diagram for explaining an example of the configuration of a pixel unit;

DESCRIPTION OF THE EMBODIMENTS

First Embodiment

Figure 2:
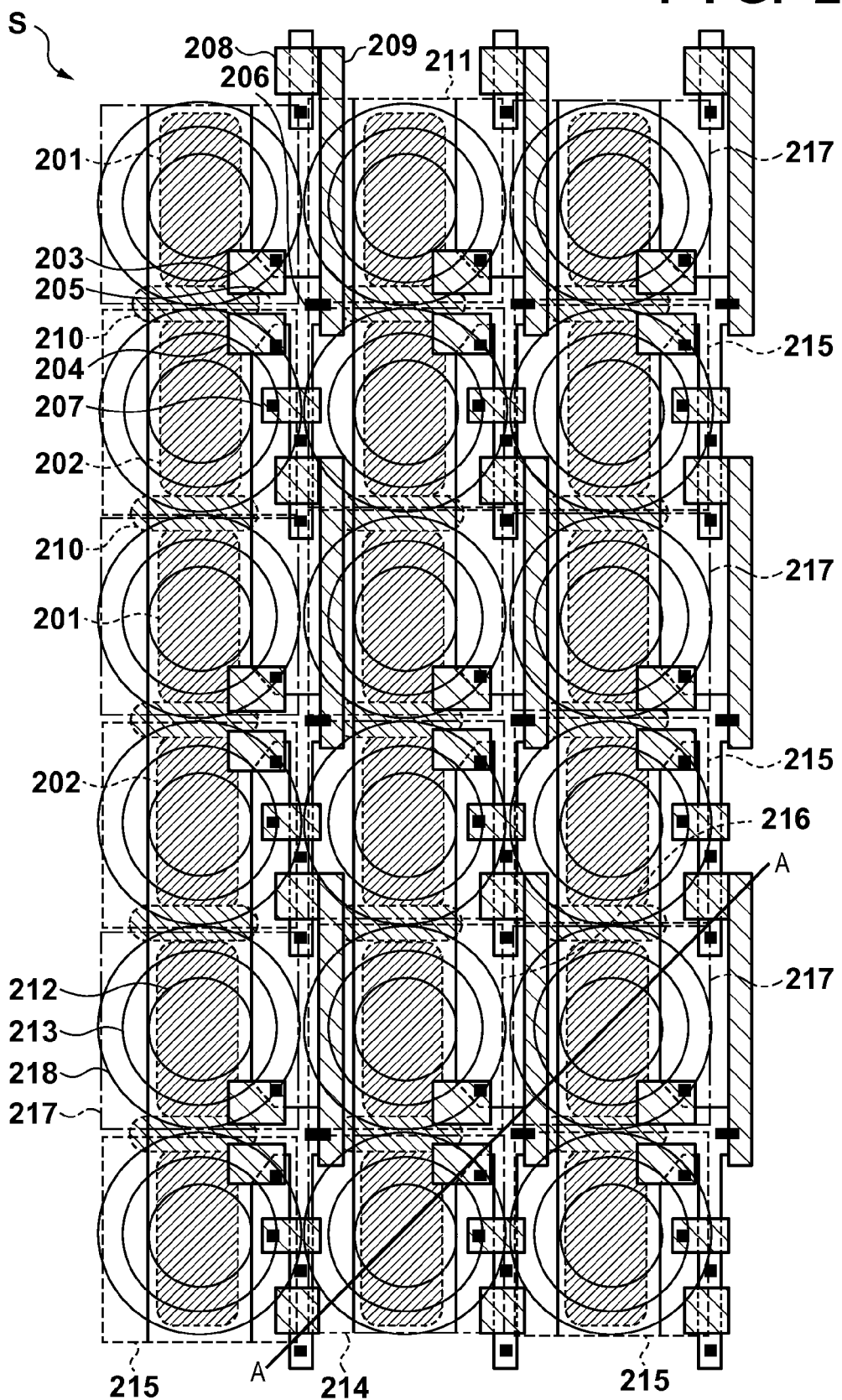
FIG. 2 is a top view for explaining an example of the layout of a sensor portion.

A solid-state image sensor 11 according to the first embodiment will be described with reference to FIGS. 1 to 8D. FIG. 1 illustrates an example of the circuit configuration of a pixel unit 100 provided in the sensor portion of the solid-state image sensor 11. The pixel unit 100 includes photoelectric conversion portions 101 and 102 (photoelectric conversion elements), transfer transistors 103 and 104, a floating diffusion (to be abbreviated as an FD hereinafter) 105, a reset transistor 106, and an amplifier transistor 108. Each of the reset transistor 106 and amplifier transistor 108 has drain and source terminals, one of which is connected to a power supply 107. The amplifier transistor 108 forms, for example, a source follower circuit. Photodiodes, for example, can be used as the photoelectric conversion portions 101 and 102. The transfer transistor 103 can be arranged in correspondence with, for example, the photoelectric conversion portion 101, and the transfer transistor 104 can be arranged in correspondence with, for example, the photoelectric conversion portion 102. The FD 105 is a diffusion region for the transfer transistors 103 and 104.

The amplifier transistor 108 can output a pixel signal to a column signal line 109. Although the pixel unit 100 adopts, as an example, a configuration in which the two photoelectric conversion portions 101 and 102 share the FD 105, amplifier transistor 108, and reset transistor 106, this embodiment is not limited to this configuration. The pixel unit 100 may use, for example, a configuration including a plurality of photoelectric conversion portions, each of which is provided with an FD 105, amplifier transistor 108, and reset transistor 106 to read out a pixel signal for each photoelectric conversion portion. Also, a select transistor which selects enabling/disabling of the output of a pixel signal, for example, may be interposed between the amplifier transistor 108 and the column signal line 109.

FIG. 2 schematically shows a projection view of the layout of a sensor portion S including an array of pixel units 100. FIG. 2 illustrates a sensor portion S including an array of 6 (rows)×3 (columns) unit pixels for the sake of simplicity. The sensor portion S corresponds to color filters in, for example, the Bayer arrangement. For example, unit pixels B each having a diffusion region 201 for detecting blue light, and unit pixels $G_B$ each having a diffusion region 202 for detecting green light can be alternately arranged on the first column. Note that the diffusion region 201 forms the photoelectric conversion portion 101, while the diffusion region 202 forms the photoelectric conversion portion 102, and the diffusion regions 201 and 202 accumulate charges upon receiving incident light. Similarly, unit pixels $G_R$ each having a diffusion region 201 for detecting green light, and unit pixels R each having a diffusion region 202 for detecting red light can be alternately arranged on the second column.

A gate electrode 203 of the transfer transistor 103 is interposed between the diffusion region 201 and an FD region 205 corresponding to the FD 105, and a gate electrode 204 of the transfer transistor 104 is interposed between the diffusion region 202 and the FD region 205 corresponding to the FD 105. The FD region 205 is connected to a gate electrode 208 of the amplifier transistor 108 via, for example, a shared contact 206 and a line pattern 209 of polysilicon. Note that the line pattern 209 may be formed by polysilicon integrated with the gate electrode 208, or that in the same layer as the gate electrode 208. The reset transistor 106 is formed by a gate electrode 207 and the FD region 205. An element isolation region 210 is interposed between the diffusion regions 201 and 202 on each column of the sensor portion S. An element isolation region 211 is interposed between respective columns. The element isolation regions 210 and 211 can suppress leakage of the charges accumulated in the diffusion regions 201 and 202, respectively. The element isolation region 210 can be formed in, for example, a diffusion region to serve as a potential barrier. Also, each set of color filters 214 to 217 is arranged in the Bayer arrangement. The color filters 214 are arranged in correspondence with the unit pixels R. The color filters 215 and 216 are arranged in correspondence with the unit pixels $G_B$ and $G_R$, respectively. The color filters 217 are arranged in correspondence with the unit pixels B. Each unit pixel is provided with a light-guiding portion 212 of a lightguide, an intra-layer lens 213, and a microlens 218.

Figure 3:
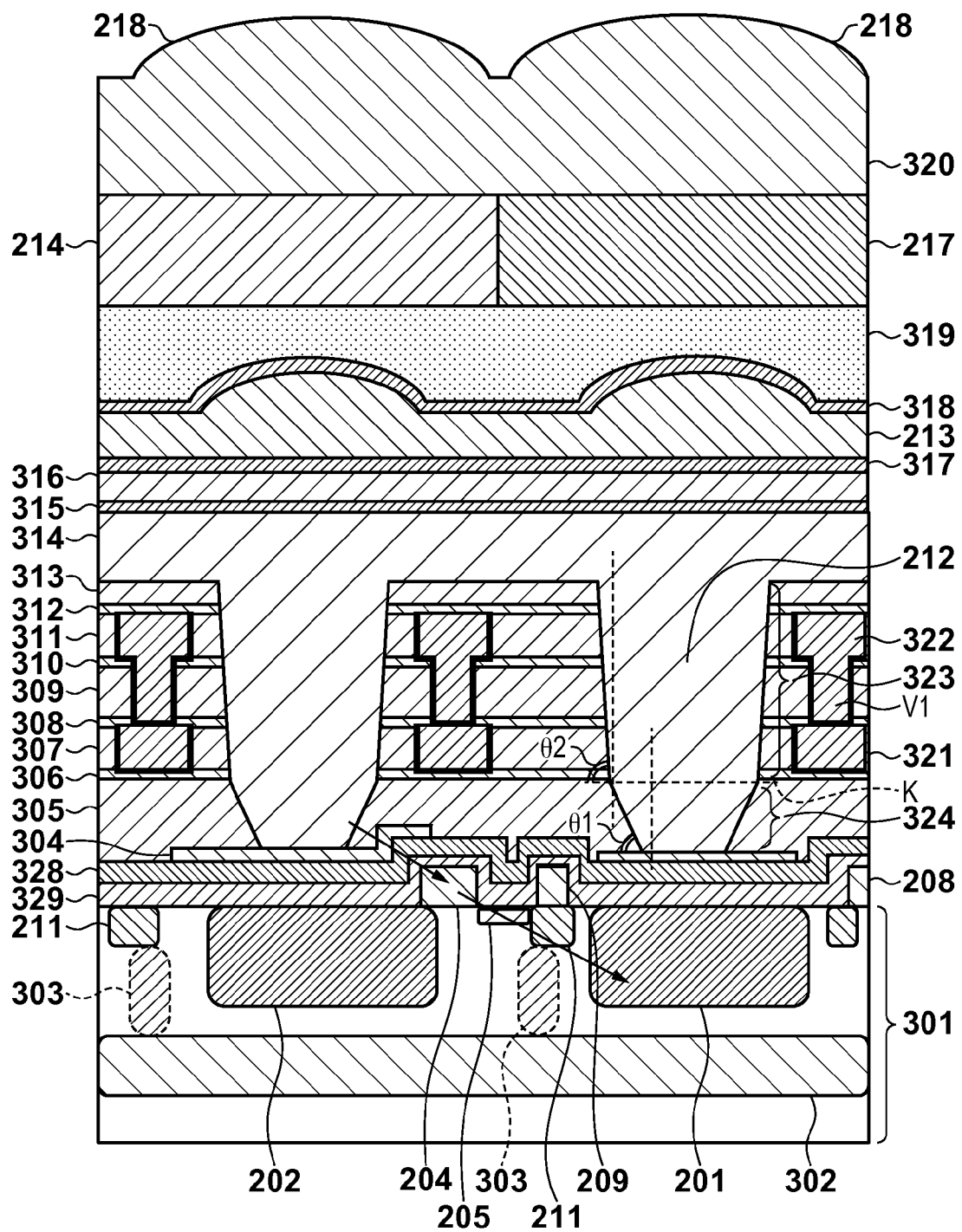
FIG. 3 is a sectional view for explaining an example of the structure of a solid-state image sensor according to the first embodiment.

FIG. 3 shows a sectional structure view (a sectional structure view of the pixels R and B in this case) taken along a cut line A-A' in the layout top view shown in FIG. 2. In a semiconductor substrate 301, unit pixels can be formed in respective regions electrically isolated by, for example, P-type element isolation regions 211 and 303. A P-type element isolation region 302 can function as a potential barrier between the deep portion and unit pixel of the semiconductor substrate 301. Insulating films 329 and 328 can be arranged to cover, for example, the N-type diffusion region 202, FD region 205, gate electrode 204, and line pattern 209. The insulating film 329 can be formed using, for example, silicon nitride, while the insulating film 328 can be formed using, for example, silicon oxide. Although not shown herein, polysilicon to serve as the gate electrode of a MOS transistor, that to serve as a line pattern used for electrical connection, and that to serve as the electrode of a capacitive element can also be arranged. These types of polysilicon can be formed with a thickness of, for example, 50 to 500 nm.

An insulating film 304 can be formed on those types of polysilicon in a region where a light-guiding portion 212 of a lightguide is to be formed. The insulating film 304 can be formed using, for example, silicon nitride, and function as an etching stop layer used in forming by etching an opening to form a light-guiding portion 212. The thicknesses and refractive indices of the insulating films 328 and 329 can be determined so that the insulating films 328 and 329 prevent reflection of light incident on the diffusion regions 201 and 202 from the light-guiding portion 212. More specifically, it is desired to set the thickness of the insulating film 328 within the range of, for example, 20 to 200 nm, and that of the insulating film 329 within the range of, for example, 10 to 100 nm. It is desired to set the refractive indices of the insulating films 328 and 329 within the range of, for example, 1.6 to 2.2.

Insulating films 305 to 313 can further be formed on the insulating films 304, 328, and 329 as interlayer insulating films. The insulating films 305, 307, 309, 311, and 313 can be formed using, for example, silicon oxide. The insulating films 306, 308, 310, and 312 can be formed using, for example, silicon nitride. Also, for, for example, signal transmission or power supply, a first interconnection pattern 321 can be formed on the insulating film 305 (first insulating layer), a second interconnection pattern 322 can be formed on the insulating film 309, and a via V1 can be formed in the opening of the insulating film 309 to connect these patterns. The first interconnection pattern 321 and second interconnection pattern 322 can be formed using, for example, copper. A barrier metal (not shown) which prevents metal diffusion may at least partially be formed in the side wall portion and bottom portion of the first interconnection pattern 321 and second interconnection pattern 322. The barrier metal can be formed using, for example, tantalum, tantalum nitride, or titanium nitride. Note that the second interconnection pattern 322 and via V1 can be formed integrally with each other using, for example, copper.

The insulating film 306 (second insulating layer) can function as an etching stop layer used in forming by etching an opening to form a first interconnection pattern 321. The insulating film 308 can prevent metal diffusion from the first interconnection pattern 321. The insulating film 310 can function as an etching stop layer used in forming by etching an opening to form a second interconnection pattern 322. The insulating film 312 can prevent metal diffusion from the second interconnection pattern 322. The insulating films 306, 308, 310, and 312 can be formed with a thickness of, for example, 10 to 200 nm, and a refractive index of, for example, 1.6 to 2.2. Also, the insulating films 305, 307, 309, 311, and 313 can be formed with a thickness of, for example, 100 to 1,000 nm, and a refractive index of, for example, 1.2 to 1.5.

A light-guiding portion 212 can be formed in the insulating films 305 to 313 to guide light to the photoelectric conversion portion. The light-guiding portion 212 can be formed using, for example, a member, with a refractive index higher than that of at least some of the insulating films 305 to 313, such as silicon nitride. This is because silicon nitride has a refractive index higher than that of silicon oxide, so a large amount of light can be reflected by the interface between the light-guiding portion 212 and the insulating films 305 to 313 in accordance with the Snell's law to suppress leakage of light from the light-guiding portion 212. With this arrangement, a lightguide is formed by the light-guiding portion 212 and at least some of the insulating films 305 to 313.

Also, an insulating film 314 can be formed on the insulating films 305 to 313 and light-guiding portion 212. The insulating film 314 can be formed integrally with, for example, the light-guiding portion 212 using the same member. An antireflection film 315, insulating film 316, antireflection film 317, intra-layer lens 213, antireflection film 318, planarizing layer 319, color filters 214, microlens layer 320, and microlens 218, for example, can further be formed on the insulating film 314. The insulating film 316 is desirably formed using, for example, silicon oxide with a thickness of 10 to 500 nm. The intra-layer lens 213 is formed using, for example, silicon nitride, and light focused on the microlens 218 is guided to the light-guiding portion 212 by the intra-layer lens 213. To form the antireflection films 315, 317, and 318, a member having an intermediate refractive index (about 1.5 to 1.8) between the refractive indices of silicon oxide and silicon nitride is desirably used, and silicon oxynitride can more specifically be used.

The shape of the light-guiding portion 212 of the lightguide will be described herein. The light-guiding portion 212 includes a first portion 324 formed in the lower portion (on the light reception side, that is, the side of the semiconductor substrate 301), and a second portion 323 formed in the upper portion (on the light incident side), and the side face of the first portion 324 has an inclination smaller than that of the side face of the second portion 323. That is, an angle θ1 that the side face of the first portion 324 makes with a plane parallel to the semiconductor substrate 301, and an angle θ2 that the side face of the second portion 323 makes with a plane parallel to the semiconductor substrate 301 satisfy θ1<θ2, as shown in FIG. 3. As the angle θ2 decreases, the amount of light, which does not satisfy the conditions under which it is totally reflected by the interface between the second portion 323 and the insulating films 305 to 313, of light which passes through the light-guiding portion 212 increases. Hence, such light may leak out of the light-guiding portion 212, thus degrading the focusing property of the solid-state image sensor 11. Therefore, the angle θ2 is desirably set within the range of, for example, 80° to 90°. The plane parallel to the semiconductor substrate 301 is defined as, for example, a plane parallel to the interface between the semiconductor substrate 301 and a gate insulating film. Also, the angle that the side face of each portion makes with the plane parallel to the semiconductor substrate 301 is defined as an inclination angle.

On the other hand, light that leaks out of the first portion 324 of the light-guiding portion 212 can strike the semiconductor substrate 301 upon passing through the gate electrode 204, as shown in FIG. 3. This is because polysilicon that can be used for the gate electrode 204 has a refractive index of 4.0, while an insulating member has a refractive index of 1.2 to 2.2, which is lower than that of the polysilicon. Hence, light that leaks out of the first portion 324 easily enters, for example, the gate electrode 204. A semiconductor substrate 301 (silicon) is arranged under the gate electrode 204 through a thin gate insulating film. Note that silicon and polysilicon have nearly the same refractive index. Therefore, after light that leaks out of the first portion 324 temporarily enters the gate electrode 204, it may enter an adjacent pixel (the unit pixel B in this case) upon passing through the semiconductor substrate 301, resulting in a color mixture between adjacent pixels. Such a phenomenon may conspicuously appear upon an increase in pixel density, and a reduction in thickness of a gate insulating film. Also, in the peripheral region of the sensor portion S, the amount of light obliquely incident on the semiconductor substrate 301 is large, so the amounts of light that leaks into the central and peripheral regions of the sensor portion S may be different, resulting in color shading.

To solve this problem, the inclination of the side face of the first portion 324 is set smaller than that of the side face of the second portion 323 (θ1<θ2) to increase the distance between the first portion 324 and the gate electrode 204. With this arrangement, light that leaks out of the first portion 324 attenuates in accordance with the distance from the light-guiding portion 212 to the gate electrode 204. Note that when the angle θ1 is set too small, the amount of light which does not satisfy the critical angle at which it is totally reflected by the interface between the first portion 324 and the insulating film 305 increases, so the focusing property of the solid-state image sensor 11 degrades. Hence, the angle θ1 is desirably set smaller than the angle θ2 by about, for example, 5° to 20° by weighing suppression of a color mixture and color shading mentioned above, and degradation in focusing property.

Figure 4:
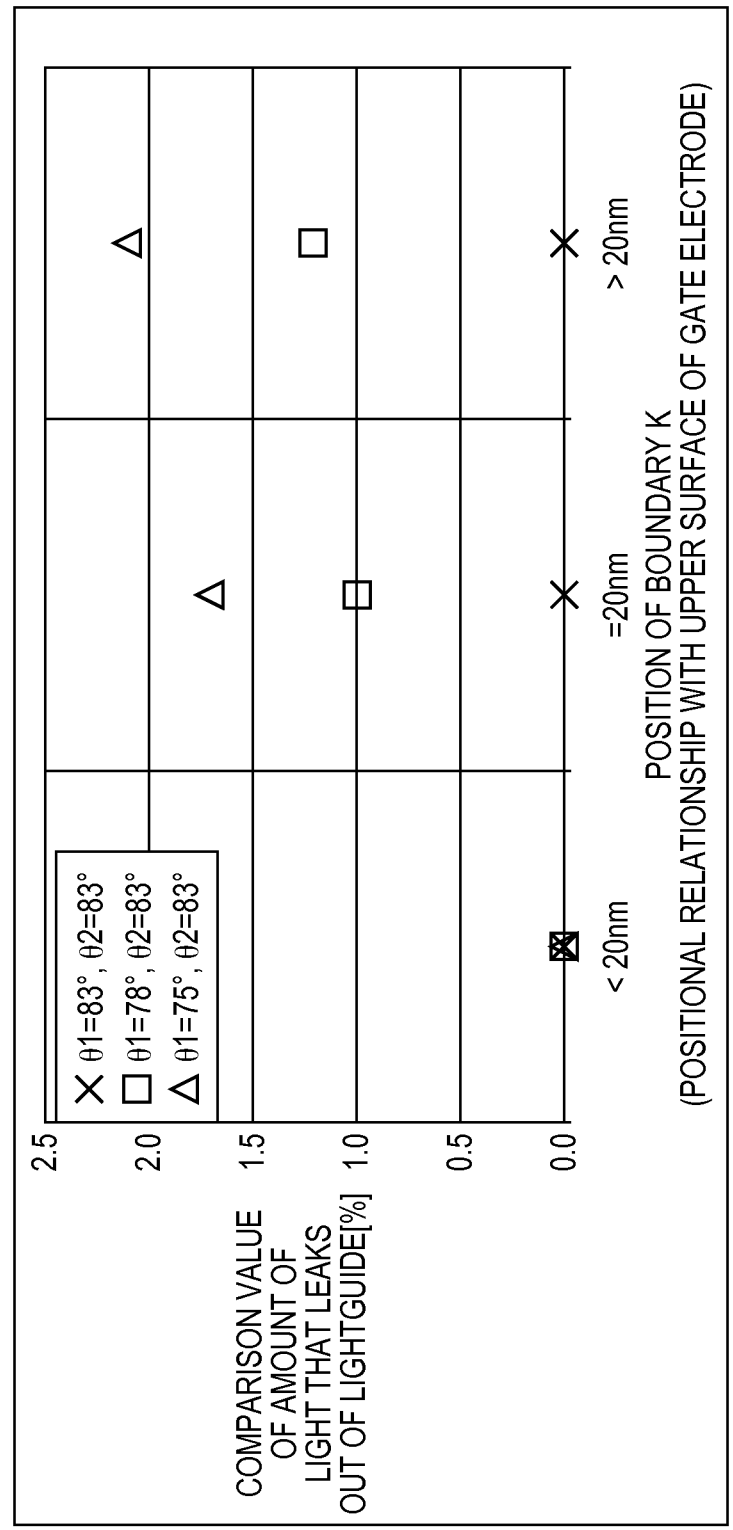
FIG. 4 is a graph for explaining the effect of the solid-state image sensor according to the first embedment.
Figure 5:
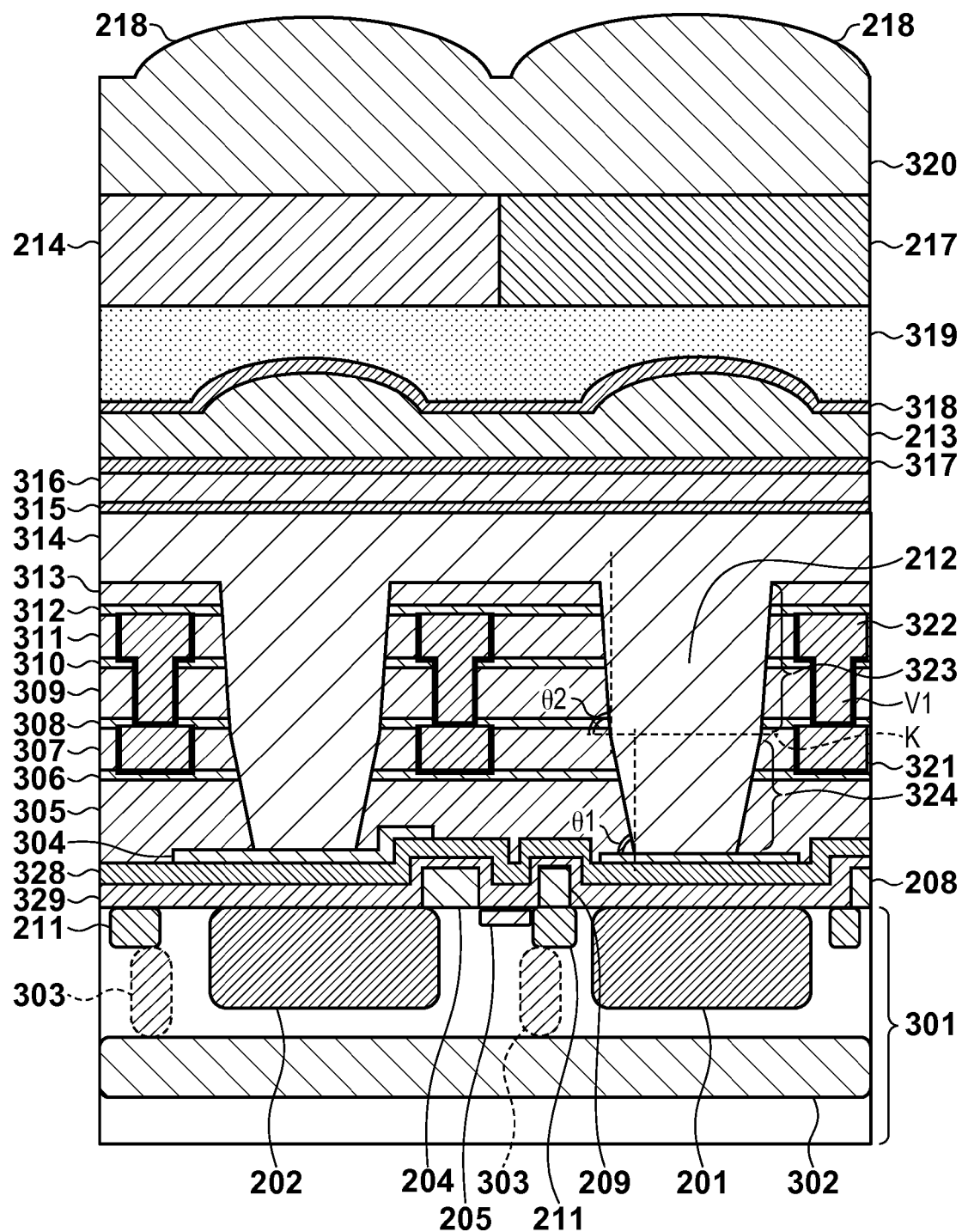
FIG. 5 is a sectional view for explaining the shape of a lightguide.
Figure 6:
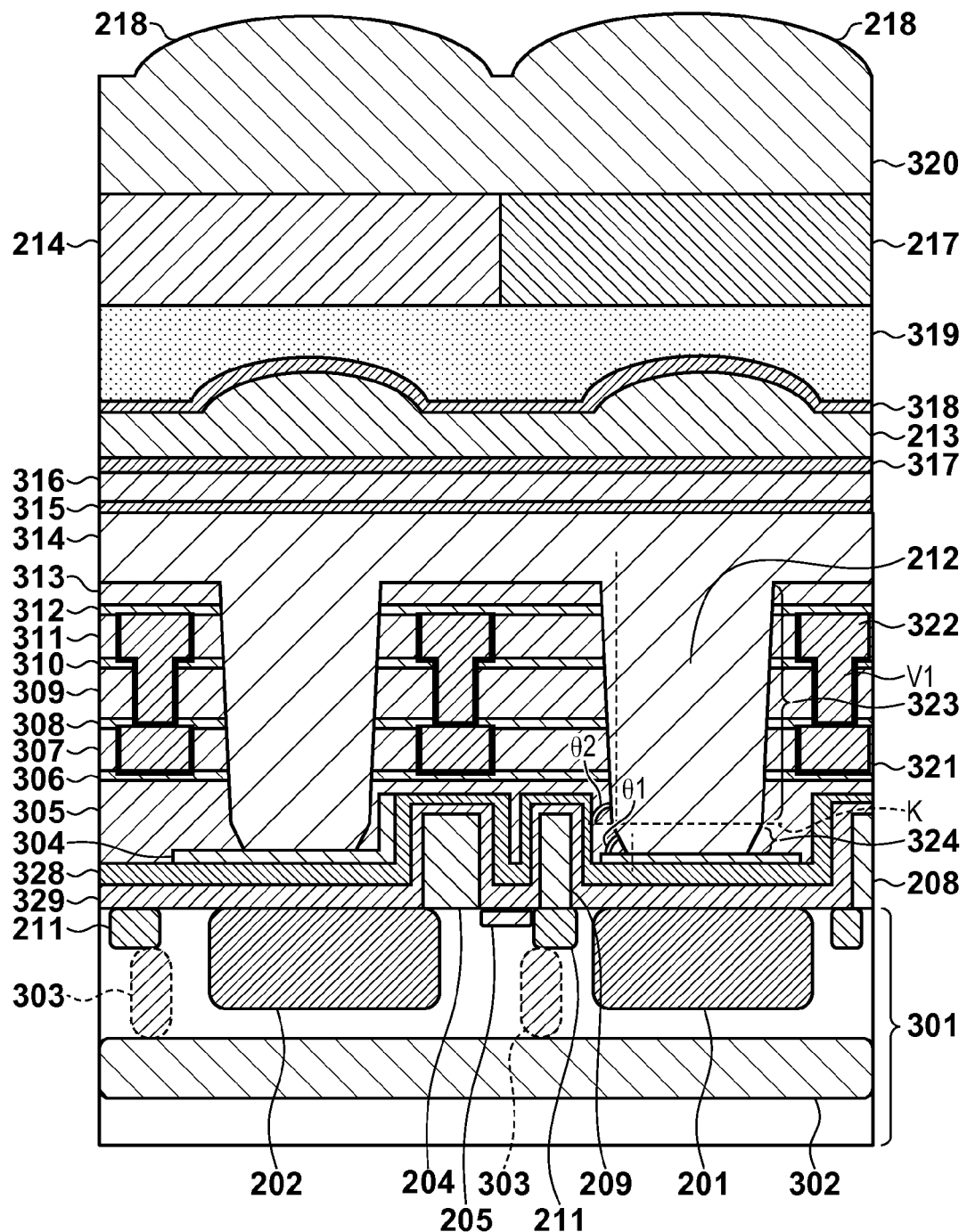
FIG. 6 is a sectional view for explaining the shape of another lightguide.

A boundary K between the first portion 324 and the second portion 323 will be described herein with reference to FIGS. 4 to 7. FIG. 4 is a graph showing a plot of the amount of light that leaks out of the light-guiding portion 212 on the ordinate as a function of the position of the boundary K on the abscissa. The abscissa more specifically represents the case wherein the boundary K is positioned lower than the insulating film 306 by 20 nm, that wherein the boundary K is positioned inside (in the middle of) the insulating film 306, and that wherein the boundary K is positioned higher than the insulating film 306 by 20 nm. The ordinate more specifically indicates the value [%] as compared to the amount of light that leaks out of the light-guiding portion 212 when θ1=θ2=83°. Plotting is done for θ1=83°, 78°, and 75° as a parameter. As can be seen from FIG. 4, the boundary K is desirably positioned lower than the insulating film 306. The insulating film 306 is formed using, for example, silicon nitride, which has a refractive index higher than that of silicon oxide, as described earlier. This means that when the boundary K is positioned higher than the insulating film 306 (the first portion 324 comes into contact with the insulating film 306), the amount of light reflected by the interface decreases, that is, the amount of light that leaks out of the light-guiding portion 212 increases, as shown in FIG. 5. Therefore, the first portion 324 and second portion 323 are desirably formed so that their boundary K is positioned lower than the insulating film 306. On the other hand, the boundary K between the first portion 324 and the second portion 323 is desirably positioned higher than the upper face of the gate electrode 204. As shown in FIG. 6, when the boundary K is positioned lower than the upper face of the gate electrode 204, the distance between the first portion 324 and the gate electrode 204 is the same as in the case of θ1=θ2, so no effect of suppressing a color mixture and color shading can be obtained. An exact position of the boundary K, which is lower than the insulating film 306, can be appropriately determined in accordance with design of, for example, the two-dimensional layout and the focal positions of the microlens 218 and intra-layer lens 213.

Figure 7:
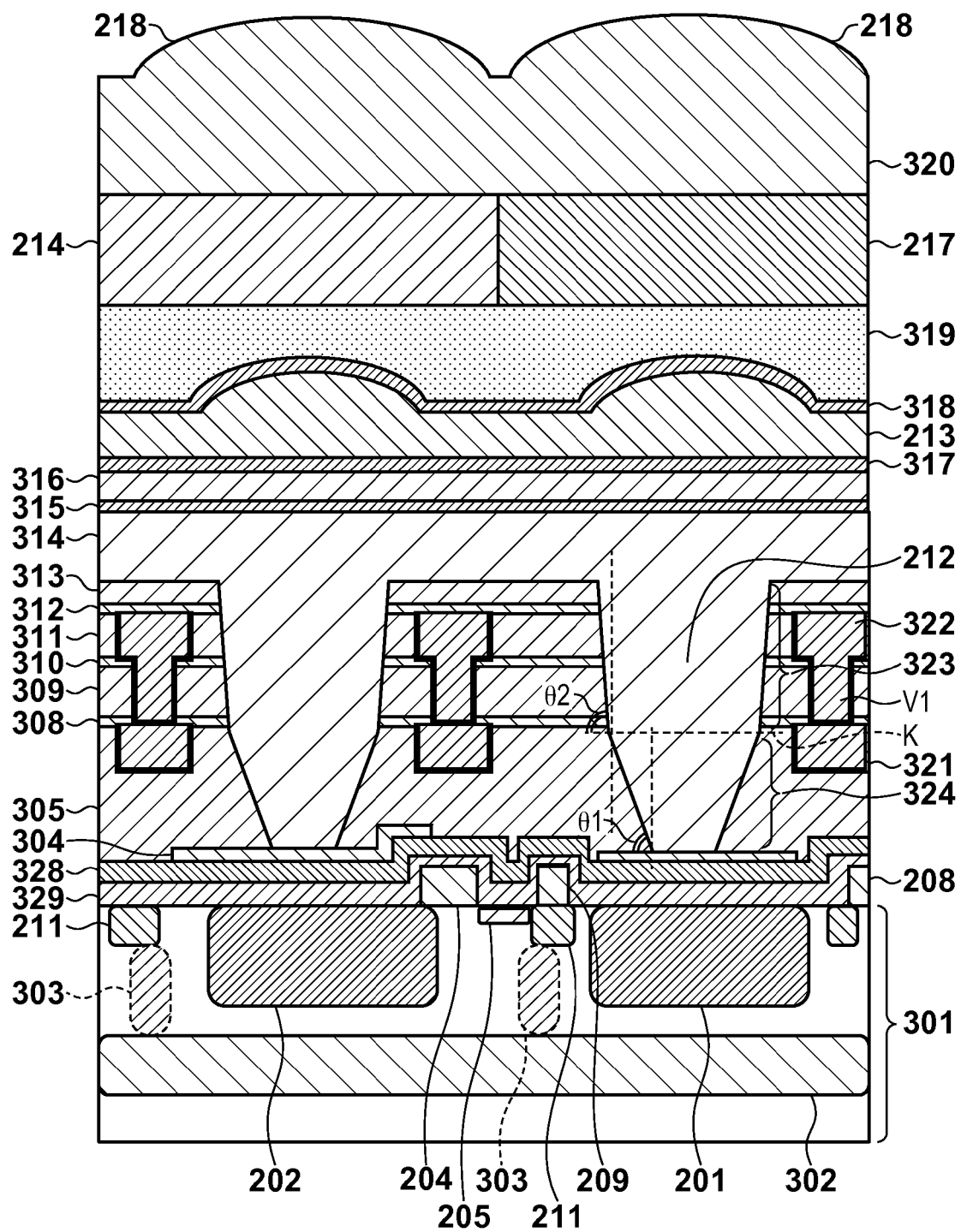
FIG. 7 is a sectional view for explaining another example of the structure of a solid-state image sensor according to the first embodiment.

FIG. 7 illustrates another example of the structure of the solid-state image sensor 11 according to this embodiment. FIG. 7 is different in that no insulating film 306 is formed. That is, FIG. 7 shows the case wherein no insulating film 306 is formed as an etching stop layer used in forming by etching an opening to form a first interconnection pattern 321. In this case, the first portion 324 and second portion 323 can be formed so that their boundary K is positioned higher than the upper face of the gate electrode 204 and lower than the insulating film 308 (second insulating layer).

Figure 8A:
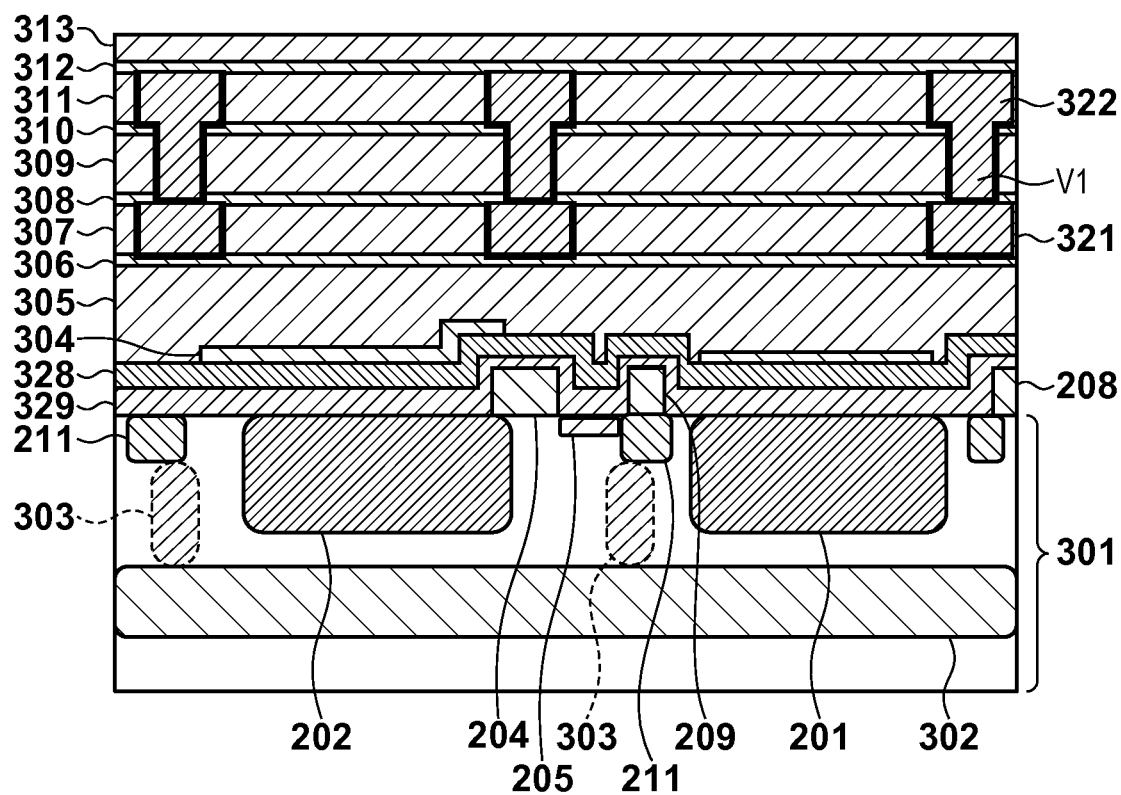
FIGS. 8A to 8D are sectional views for explaining an example of a method of manufacturing a solid-state image sensor according to the first embodiment.

A method of manufacturing a solid-state image sensor 11 shown in FIG. 3 will be described below with reference to FIGS. 8A to 8D. Especially a step of forming a light-guiding portion 212 in this method will be described in detail. First, impurity diffusion regions (for example, a diffusion region 201) and patterns (for example, a gate electrode 204), as described with reference to FIG. 3, can be formed in a semiconductor substrate 301 using a known semiconductor manufacturing method, as shown in FIG. 8A. With this operation, predetermined elements are formed in the semiconductor substrate 301. Interconnection patterns (for example, a first interconnection pattern 321) and interlayer insulating films (for example, an insulating film 305) can be formed on the semiconductor substrate 301. The insulating films 305 to 313 have a stacked structure of a film made of silicon oxide, and a film made of silicon nitride. In this embodiment, of the insulating films 305 to 313, an insulating film made of silicon nitride has a thickness smaller than that of an insulating film made of silicon oxide.

Figure 8B:
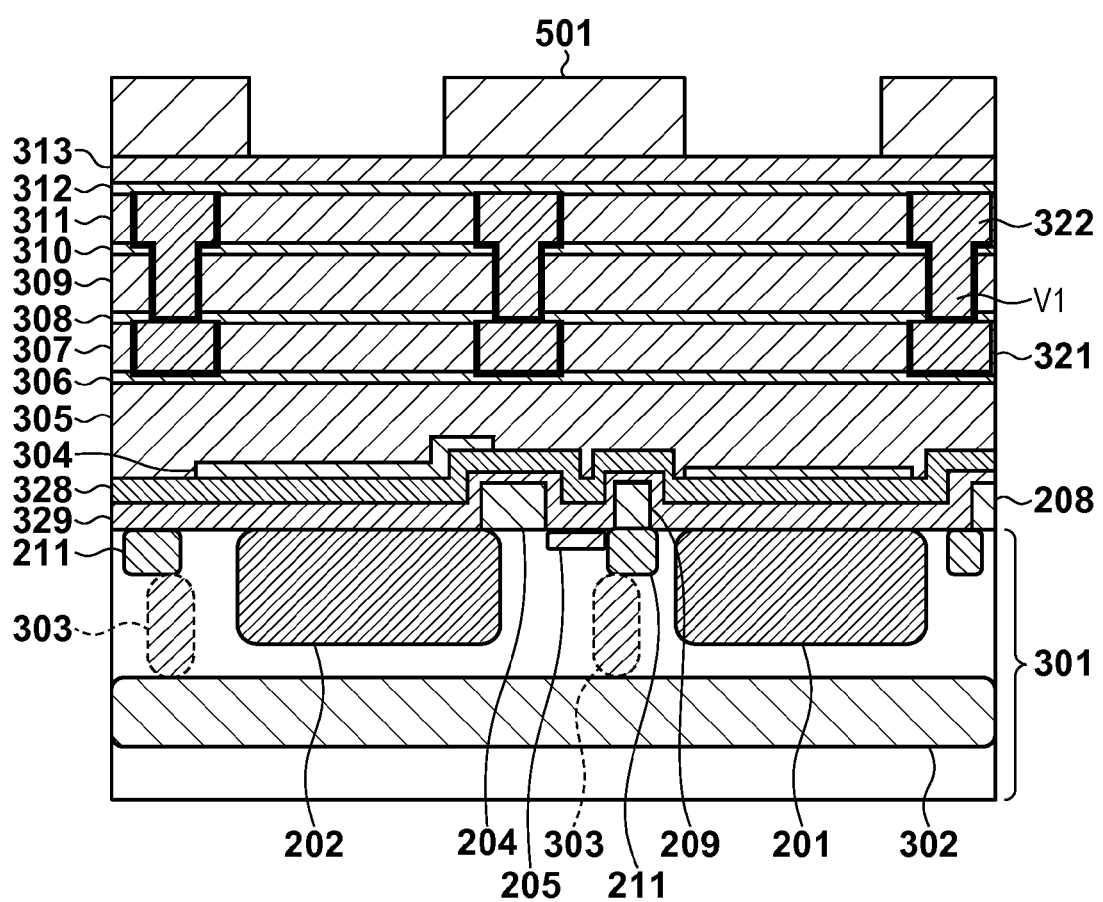
Figure 8C:
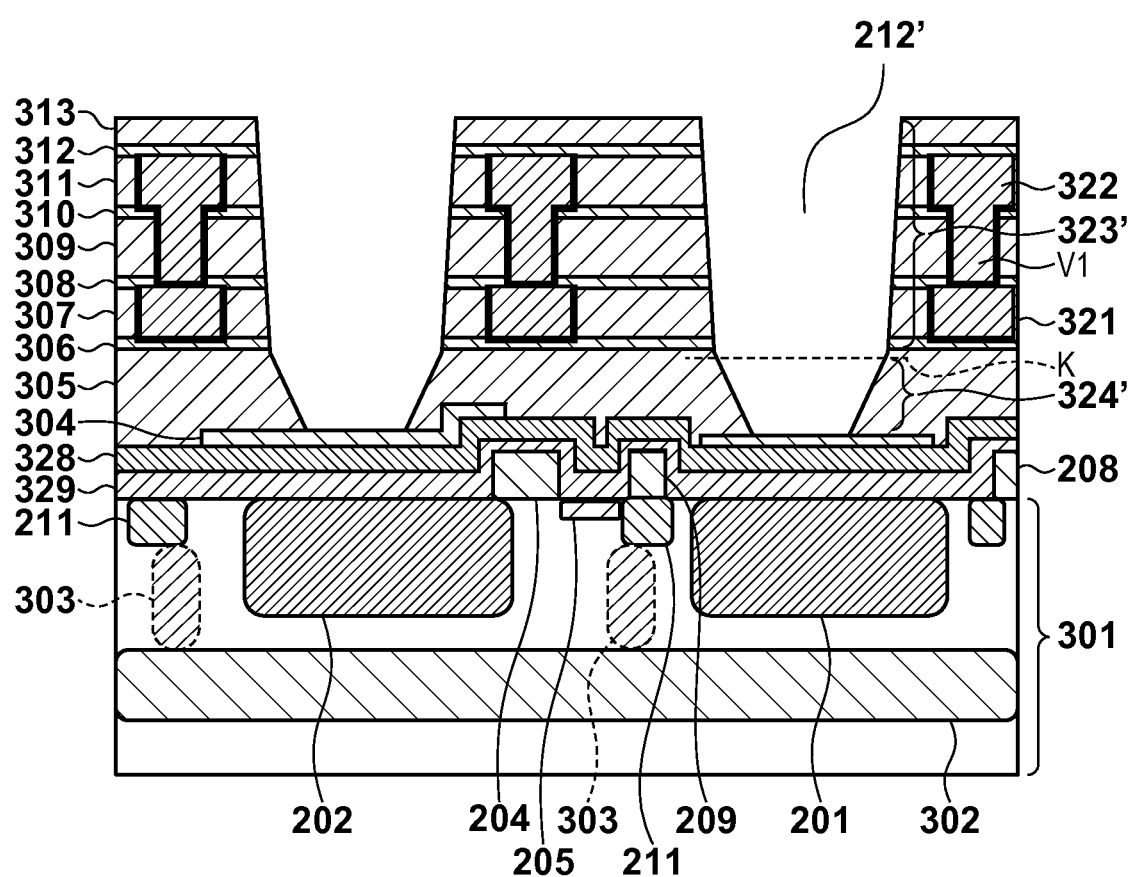

A resist pattern 501 having an opening can be formed in a region where a light-guiding portion 212 is to be formed, as shown in FIG. 8B. The insulating films 305 to 313 can be etched using the resist pattern 501 as a mask. With this operation, an opening 212' can be formed in the insulating films 305 to 313, as shown in FIG. 8C. In this etching step, the insulating film 304 can function as an etching stop layer, as described earlier. Also, this etching step is desirably performed by dry etching.

More specifically, the above-mentioned etching step can be performed in, for example, the following procedure. First, the insulating films 307 to 313 may be etched (first etching step). This etching step can be performed under the conditions in which the etching selectivity of each of the insulating films 307 to 313 formed by silicon oxide or silicon nitride is low. More specifically, the insulating films 307 to 313 can be etched using, for example, a gas mixture containing a hydrogen-containing fluorocarbon gas such as $CHF_3$ and a fluorocarbon gas such as $C_4F_8$, oxygen, and an inert gas such as argon. By etching under constant etching conditions, an opening 323' in the portion of a region where a second portion 323 is to be formed later can be formed to be inclined by a predetermined angle.

Next, the insulating film 306 can be etched (second etching step). The insulating film 306 can be etched under the conditions in which the etching rate of the insulating film 305 is higher than that of the insulating film 306. More specifically, the insulating film 306 can be etched by anisotropic plasma etching using, for example, a hydrogen-containing fluorocarbon gas such as $CH_2F_2$, oxygen, and an inert gas such as argon. The insulating film 305 can function as an etching stop layer used in etching the insulating film 306. Also, the position at which the insulating film 305 is exposed after the insulating film 306 is etched can serve as the above-mentioned boundary K. Therefore, by adjusting the amount of etching of the insulating film 305 in etching the insulating film 306, the position of the boundary K between a first portion 324 and a second portion 323 to be formed later can be adjusted. Note that in the first etching step, the insulating film 306 may be etched, or both the insulating films 305 and 306 may be etched.

The insulating film 305 can then be etched (third etching step). This etching step can be performed under the conditions in which the exposed insulating film 305 is preferentially etched. Note that the conditions under which the insulating film 305 is etched are different from those under which the insulating films 307 to 313 are etched. More specifically, the conditions such as the types of etching gas, the mixing ratio of etching gases, and the RF power are different. With this operation, an opening 212' can be formed so that the inclination of an opening 324' in a portion corresponding to the first portion 324 becomes smaller than that of the opening 323' in a portion corresponding to the second portion 323. The insulating film 304 can function as an etching stop layer used in etching the insulating film 305. Also, the resist pattern 501 of the photoresist can be removed to form an opening 212' of the light-guiding portion 212.

Figure 8D:
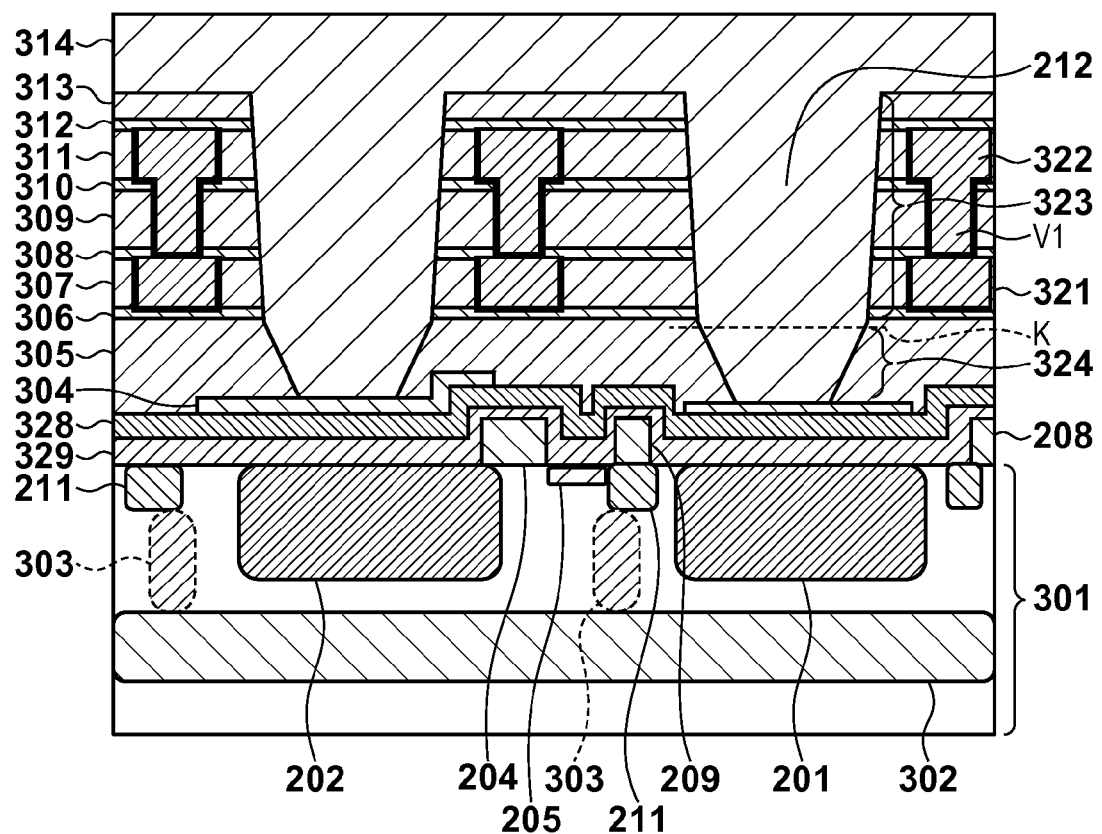

Subsequently, a high refractive index member, for example, is buried in the opening 212' to form a light-guiding portion 212, as shown in FIG. 8D. This member may further be deposited so as to cover the light-guiding portion 212 and insulating films 304 to 313 to form an insulating film 314. Silicon nitride can be buried in the opening 212' using, for example, the high density plasma CVD method. The insulating film 314 is planarized by etch-back or CMP. Note that the high refractive index member need only have a refractive index higher than that of a material that constitutes most of the insulating films 305 to 313 which cover its side face. In this embodiment, silicon nitride is used as an example of the high refractive index member.

Lastly, a structure shown in FIG. 3 can be obtained as an antireflection film 315 and the like, an insulating film 316 and the like, an intra-layer lens 213, a planarizing layer 319, color filters 214 and the like, a microlens layer 320, and a microlens 218 are formed. The above-mentioned manufacturing method can be performed as needed using a known semiconductor manufacturing method.

In the light-guiding portion 212 of the solid-state image sensor 11 obtained by the above-mentioned process, the inclination of the side face of the first portion 324 is set smaller than that of the side face of the second portion 323 (θ1<θ2) to increase the distance between the first portion 324 and the gate electrode 204. With this arrangement, light that leaks out of the first portion 324 attenuates in accordance with the distance from the light-guiding portion 212 to the gate electrode 204. Hence, the solid-state image sensor 11 is advantageous in terms of improving the focusing property to suppress leakage of light from the light-guiding portion 212.

Note that a lightguide may be formed by a light-guiding portion and a groove (so-called air gap). More specifically, a lightguide may be formed by a groove (so-called air gap) which is formed in the insulating films 305 to 313 and surrounds a portion to serve as a light-guiding portion in some of the insulating films 305 to 313. In this case, the interface between the groove and the portion to serve as a light-guiding portion in some of the insulating films 305 to 313 can be considered as a side face. Also, since the line pattern 209 easily receives light from the light-guiding portion, it desirably has the light-guiding portion in this embodiment.

Second Embodiment

Figure 9:
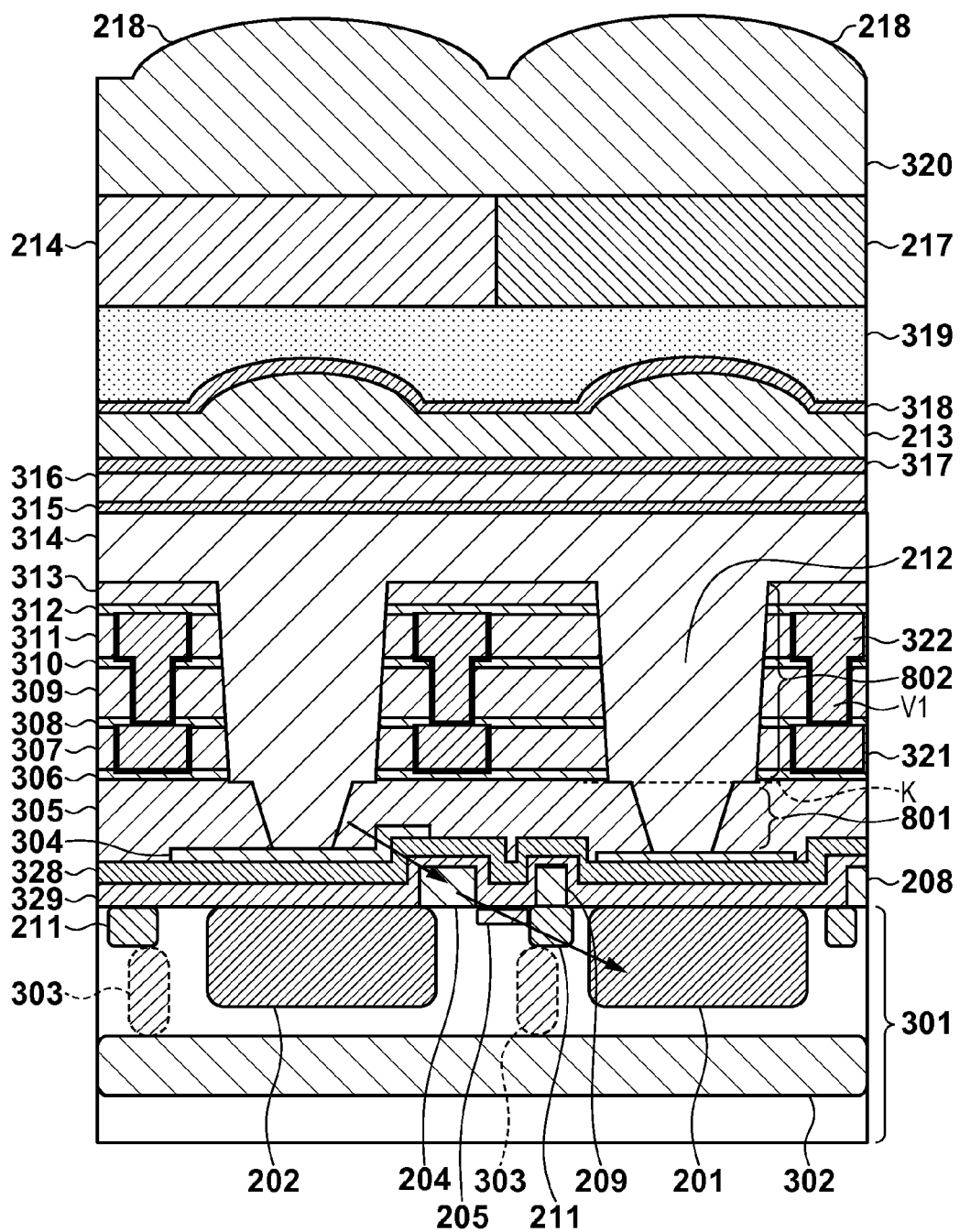
FIG. 9 is a sectional view for explaining an example of the structure of a solid-state image sensor according to the second embodiment.

A solid-state image sensor 12 according to the second embodiment will be described with reference to FIGS. 9 and 10A to 10C. FIG. 9 shows a sectional structure view (a sectional structure view of pixels R and B in this case) taken along a cut line A-A' in the layout top view shown in FIG. 2. The second embodiment is different from the first embodiment in that in the former the size of a first portion 801 of a light-guiding portion 212 is relatively small at a boundary K. Also, the boundary K between the first portion 801 and a second portion 802 of the light-guiding portion 212 may be positioned lower than an insulating film 306, as will be described in the first embodiment. As the light-guiding portion 212 adopts such a shape, the distance between the first portion 801 and a gate electrode 204 further increases, so an effect as described in the first embodiment can be obtained more efficiently.

Figure 10A:
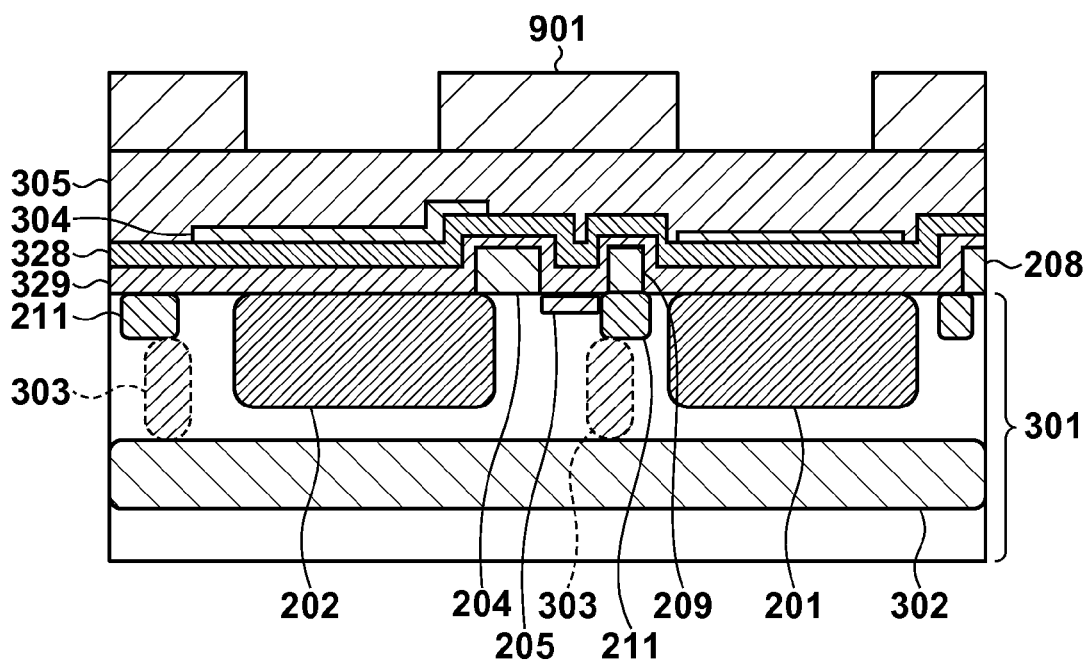
FIGS. 10A to 10C are sectional views for explaining an example of a method of manufacturing a solid-state image sensor according to the second embodiment.

A method of manufacturing a solid-state image sensor 12 will be described below with reference to FIGS. 10A to 10C. First, predetermined elements are formed in a semiconductor substrate 301 using a known semiconductor manufacturing method, as shown in FIG. 10A. Insulating films 329 and 328 can be formed to cover the semiconductor substrate 301, an insulating film 304 can be formed on the insulating films 329 and 328 in a region where a light-guiding portion 212 is to be formed, and an insulating film 305 can be formed to cover the insulating films 329, 328, and 304. A resist pattern 901 having an opening can be formed in a region where a light-guiding portion 212 is to be formed.

Next, the insulating film 305 can be etched using the resist pattern 901 as a mask. This etching step can be performed under the same conditions as in the third etching step of the first embodiment (the etching step of the insulating film 305).

Figure 10B:
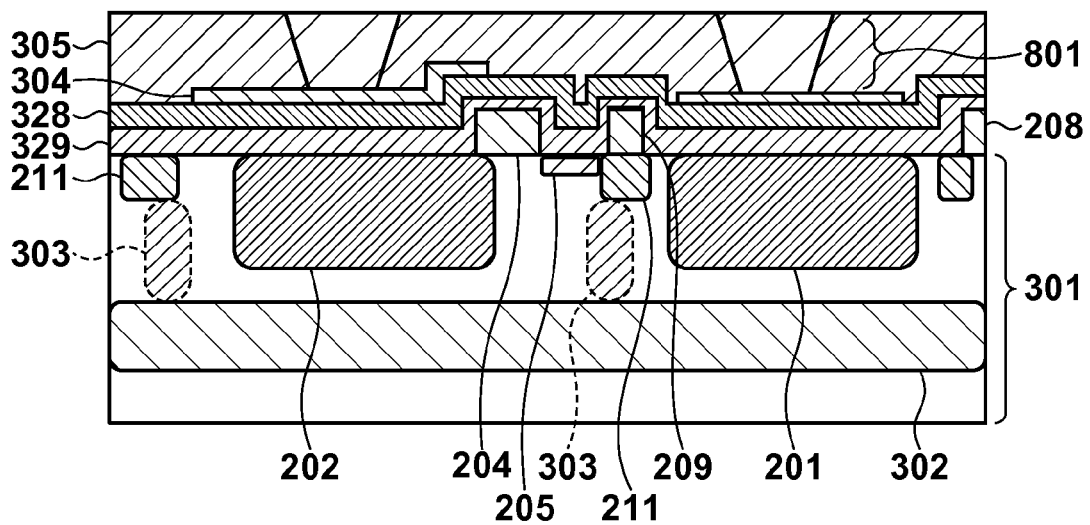

With this operation, by forming an opening in a portion corresponding to a first portion 801, and burying a high refractive index member such as silicon nitride in the opening, the first portion 801 can be formed, as shown in FIG. 10B. This operation can be done using, for example, the high density plasma CVD method. Planarization may then be done by, for example, etch-back or CMP.

Figure 10C:
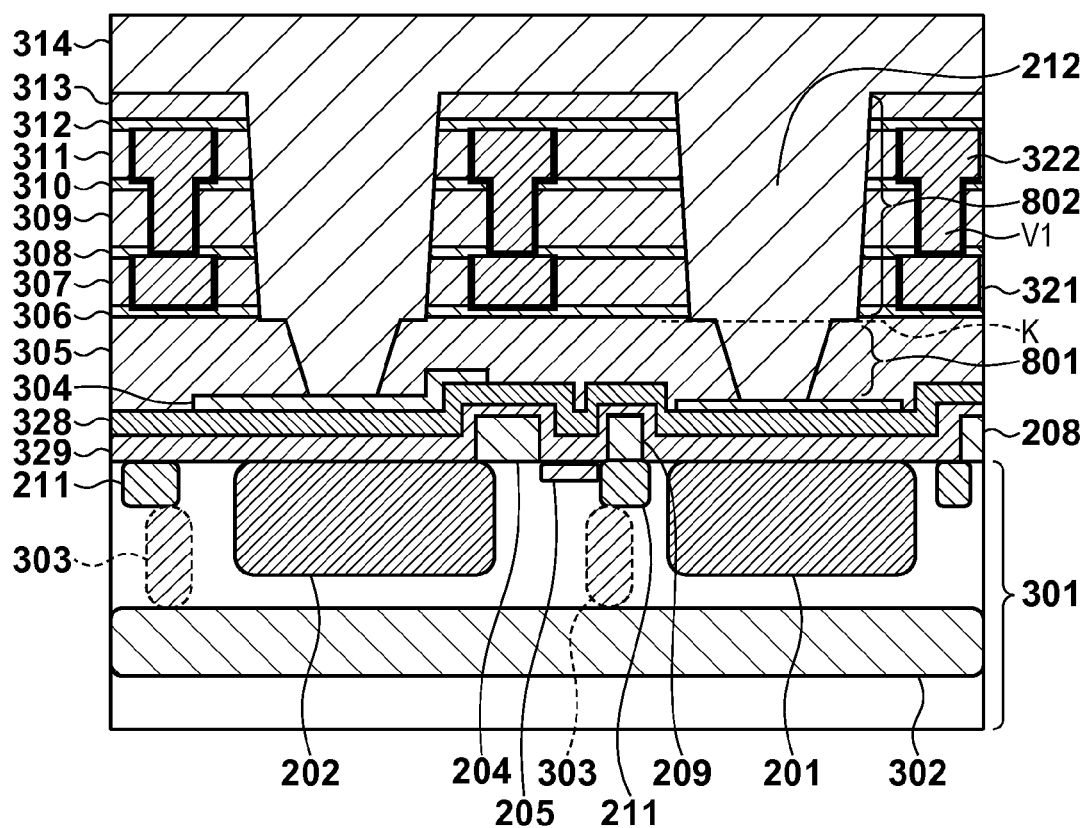

Interconnection patterns (for example, a first interconnection pattern 321) and interlayer insulating films (insulating films 306 to 313) can then be formed on the insulating film 305 using a known semiconductor manufacturing method, as shown in FIG. 10C. Similarly, a resist pattern (not shown) having an opening can be formed on the interconnection patterns and interlayer insulating films in a region where a light-guiding portion 212 is to be formed. The insulating films 307 to 313 can be etched using the resist pattern as a mask. This etching step can be performed under the same conditions as in the first etching step of the first embodiment (the etching step of the insulating films 307 to 313).

Subsequently, the insulating film 306 can be etched. This etching step can be performed under the same conditions as in the second etching step of the first embodiment (the etching step of the insulating film 306). Also, as in the first embodiment, the position at which the insulating film 305 is exposed after the insulating film 306 is etched can serve as the above-mentioned boundary K. Therefore, by adjusting the amount of etching of the insulating film 305 in etching the insulating film 306, the position of the boundary K between a first portion 324 and a second portion 323 to be formed later can be adjusted. With this operation, an opening in a portion corresponding to the second portion 802 can be formed inside the insulating films 305 to 313. Lastly, by burying a high refractive index member such as silicon nitride in the opening, a second portion 802 of a light-guiding portion 212 can be formed, as shown in FIG. 9.

In the light-guiding portion 212 of the solid-state image sensor 12 obtained by the above-mentioned process, the inclination of the side face of the first portion 801 is set smaller than that of the side face of the second portion 802 (θ1<θ2) to increase the distance between the first portion 801 and the gate electrode 204. With this arrangement, light that leaks out of the first portion 801 attenuates in accordance with the distance from the light-guiding portion 212 to the gate electrode 204. Hence, the solid-state image sensor 12 is advantageous in terms of improving the focusing property to suppress leakage of light from the light-guiding portion 212.

Although two embodiments have been described above, the present invention is not limited to them, and the object, state, use purpose, function, and other specifications can be changed as needed, so the present invention can also be practiced by other embodiments, as a matter of course. Also, the respective embodiments can be combined as needed. As an example, although the sensor portion S serves as a CMOS image sensor, it may serve as all other types of sensors. As another example, the structure described in each of the above-mentioned embodiments may have a conductivity type opposite to the above case. As still another example, although the positional relationship between the first portion 324 of the light-guiding portion 212, and the gate electrode 204 of the transfer transistor 104 has been explained in the above-mentioned embodiments, the same applies to the relationship with other types of polysilicon. Other types of polysilicon can include polysilicon to serve as the gate electrode of a MOS transistor, that to serve as a line pattern used for electrical connection, and that to serve as the electrode of a capacitive element.

Also, although a solid-state image sensor included in a camera has been described in the above-mentioned embodiments, the concept of the camera includes not only an apparatus mainly intended for image capture but also an apparatus (for example, a personal computer and a portable terminal) additionally provided with an image capture function. The camera includes a solid-state image sensor according to the present invention, as illustrated in each of the above-mentioned embodiments, and a processing unit which processes a signal output from the solid-state image sensor. The processing unit can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-120137, filed May 25, 2012, which is hereby incorporated by reference herein in its entirety.

What is claimed is:

1. A solid-state image sensor comprising a photoelectric conversion portion, a MOS transistor, a first insulating layer which covers the photoelectric conversion portion and the MOS transistor, a second insulating layer which is provided on the first insulating layer and has a refractive index higher than a refractive index of the first insulating layer, and a light-guiding portion which is provided in the first insulating layer and the second insulating layer and is provided in correspondence with the photoelectric conversion portion, the light-guiding portion including a first portion, and a second portion which is arranged on the first portion and contacts the first portion, wherein a sharp angle formed by a side face of the first portion and a plane parallel to a light-receiving face of the photoelectric conversion portion is smaller than a sharp angle formed by a plane parallel to the light-receiving face and a side face of a part of the second portion closest to the first portion, and a boundary between the first portion and the second portion is positioned higher than an upper face of a gate electrode of the MOS transistor, and lower than a boundary between the first insulating layer and the second insulating layer.

2. The sensor according to claim 1, wherein the light-guiding portion is formed by a member with a refractive index higher than refractive indices of the first insulating layer and the second insulating layer.

3. The sensor according to claim 1, wherein the first insulating layer is formed by silicon oxide, the second insulating layer is formed by silicon nitride, and the light-guiding portion is formed by silicon nitride.

4. The sensor according to claim 1, wherein the sensor further comprises a color filter provided above the light-guiding portion.

5. The sensor according to claim 1, wherein
the sensor comprises a floating diffusion which is provided in correspondence with the photoelectric conversion portion,
the MOS transistor includes an amplifier transistor, and
the sensor comprises a line pattern configured to connect the floating diffusion and a gate electrode of the amplifier transistor in a layer identical to a layer of the gate of the amplifier transistor.

6. The sensor according to claim 1, wherein the first portion of the light-guiding portion is positioned to have a bottom face parallel to an upper face of the semiconductor substrate.

7. The sensor according to claim 1, wherein a sharp angle formed by the side face of the first portion and the light-receiving face of the photoelectric conversion portion is smaller than a sharp angle formed by the side face of the part of the second portion and the boundary between the first portion and the second portion.

8. The sensor according to claim 1, further comprising a third insulating layer which is provided on the second insulating layer and has a refractive index lower than a refractive index of the second insulating layer,
 wherein a sharp angle formed by a plane parallel to the light-receiving face and a side face of a first part of the second portion in contact with the first insulating layer, a sharp angle formed by a plane parallel to the light-receiving face and a side face of a second part of the second portion in contact with the second insulating layer, and a sharp angle formed by a plane parallel to the light-receiving face and a side face of a third part of the second portion in contact with the third insulating layer, are equal to each other.

9. The sensor according to claim 1, wherein a width of a bottom face of the second portion is larger than a width of an upper face of the first portion.

10. A camera comprising
 a solid-state image sensor defined in claim 1, and
 a processor configured to process a signal output from the solid-state image sensor.

* * * * *